United States Patent
Kim et al.

(10) Patent No.: US 7,348,208 B2
(45) Date of Patent: Mar. 25, 2008

(54) ORGANIC ELECTROLUMINESCENT DEVICE USING MIXTURE OF PHOSPHORESCENT MATERIAL AS LIGHT-EMITTING SUBSTANCE

(75) Inventors: Mu Hyun Kim, Suwon (KR); Min Chul Suh, Seongnam (KR); Byung Doo Chin, Seongnam (KR); Seong Taek Lee, Suwon (KR); Jang Hyuk Kwon, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 45 days.

(21) Appl. No.: 11/011,434

(22) Filed: Dec. 15, 2004

(65) Prior Publication Data

US 2005/0095458 A1    May 5, 2005

Related U.S. Application Data

(63) Continuation of application No. 10/404,134, filed on Apr. 2, 2003, now Pat. No. 6,870,198.

(30) Foreign Application Priority Data

Jun. 20, 2002    (KR) ............................... 2002-34692

(51) Int. Cl.
*H01L 51/40*    (2006.01)
(52) U.S. Cl. .................... 438/99; 438/82; 257/103; 257/98
(58) Field of Classification Search ............. 438/99, 438/FOR. 135, 82; 257/40, 103, 102, 98, 257/E23.018, E21.024
See application file for complete search history.

(56) References Cited

U.S. PATENT DOCUMENTS

| 6,097,147 | A   | 8/2000  | Baldo et al. ............. 313/506 |
| 6,303,238 | B1  | 10/2001 | Thompson et al. ......... 428/690 |
| 6,310,360 | B1  | 10/2001 | Forrest et al. ............. 257/40 |
| 6,392,250 | B1* | 5/2002  | Aziz et al. ................ 257/40 |
| 6,515,298 | B2  | 2/2003  | Forrest et al. ............. 257/40 |
| 6,579,630 | B2  | 6/2003  | Li et al. .................. 428/690 |

(Continued)

FOREIGN PATENT DOCUMENTS

| CN | 1535483     | 10/2004 |
| EP | 1 202 608 A2 | 5/2002  |

(Continued)

OTHER PUBLICATIONS

Office Action issued on Jul. 20, 2007 by the Chinese Intellectual Property Office for Chinese Patent Application No. 03145106.3.

*Primary Examiner*—W. David Coleman
*Assistant Examiner*—Su C. Kim
(74) *Attorney, Agent, or Firm*—Stein, McEwen & Bui, LLP

(57) ABSTRACT

An organic EL device which includes a first electrode, a hole transport layer, a light-emitting layer, and the second electrode, wherein the light-emitting layer includes a mixed light-emitting film of a host substance, which is capable of transferring an energy to another light-emitting polymer by absorbing the energy, and a phosphorescent dopant which is capable of emitting light using a triplet state after absorbing the energy received. Accordingly, the light-emitting layer can be patterned, and a color purity and light-emitting characteristics of a full color organic polymer EL device, produced through a laser induced termal imaging operating, can be improved.

24 Claims, 2 Drawing Sheets

U.S. PATENT DOCUMENTS

| | | |
|---|---|---|
| 6,579,632 B2 | 6/2003 | Thompson et al. ......... 428/690 |
| 6,603,150 B2 | 8/2003 | Liao et al. .................... 257/98 |
| 6,645,645 B1 | 11/2003 | Adachi et al. ............. 428/690 |
| 6,660,410 B2 | 12/2003 | Hosokawa ................. 428/690 |
| 6,699,597 B2 * | 3/2004 | Bellmann et al. ........... 428/690 |
| 6,828,042 B2 * | 12/2004 | Imanishi .................... 428/690 |
| 2002/0045061 A1 | 4/2002 | Hosokawa |
| 2002/0098377 A1 * | 7/2002 | Cao et al. ................... 428/690 |
| 2002/0100906 A1 * | 8/2002 | Takiguchi et al. ........... 257/40 |
| 2003/0025445 A1 * | 2/2003 | Lee ........................... 313/503 |
| 2005/0095357 A1 * | 5/2005 | Kim et al. .................... 427/66 |

FOREIGN PATENT DOCUMENTS

| | | |
|---|---|---|
| JP | 2001-257076 | 9/2001 |
| WO | 00/70655 | 11/2000 |
| WO | 01/39234 | 5/2001 |
| WO | 01/93642 | 12/2001 |
| WO | 02/15645 | 2/2002 |
| WO | WO 02/074015 | 9/2002 |

* cited by examiner

ORGANIC ELECTROLUMINESCENT DEVICE USING MIXTURE OF PHOSPHORESCENT MATERIAL AS LIGHT-EMITTING SUBSTANCE

CROSS-REFERENCE TO RELATED APPLICATIONS

This application claims the benefit of Korean Application No. 2002-34692, filed Jun. 20, 2002, in the Korean Intellectual Property Office, the disclosure of which is incorporated herein by reference.

CROSS REFERENCE

This application is a continuation of prior U.S. patent application Ser. No. 10/404,134, filed on Apr. 2, 2003 now U.S. Pat. No. 6,870,198, which claims the benefit of Korean Application No. 2002-34692, filed on Jun. 20, 2002, both of which are hereby incorporated by reference for all purposes as if fully set forth herein.

BACKGROUND OF THE INVENTION

1. Field of the Invention

The present invention relates to an organic polymer electroluminescent device, and more particularly, to an organic polymer electroluminescent device using a mixture of laser induced thermal imaging enabling phosphorescent materials as a light-emitting substance.

2. Description of the Related Art

Generally, an organic electroluminescent device includes an anode and a cathode, a hole injection layer, a hole transport layer, an emission layer, an electron transport layer and an electron injection layer. The organic electroluminescent (hereinafter referred to as EL) device is classified into a fluorescent device which uses a singlet and a phosphorescent device which uses a triplet, according to a light-emitting mechanism, and a high molecular device and a low molecular device according to materials used. In case of the low molecular organic EL device, each of the layers is introduced by a vacuum-deposition. In case of the high molecular organic EL device, a light-emitting device is fabricated using, for example, a spin-coating process or an inkjet process.

Recently, an organic EL device is spotlighted as a large area providing material since it has a high efficiency compared with a fluorescent material.

A low molecular organic EL device is disadvantageous in terms of a mass-production since a full color device is fabricated by depositing each layer using a mask while a fluorescent device and a phosphorescent device are fabricated by introducing each layer using a vacuum-deposition. Patents and Publications on a low molecular organic EL device include U.S. Pat. Nos. 6,310,360, 6,303,238, 6,097,147, and International Patent Publication Nos. WO 00/70655, WO 01/39234, WO 01/93642 and WO 02/15645.

These patents and publications do not relate to a patterning process using a laser induced thermal imaging or an ink jet printing, but rather to a composition and a material of a phosphorescent device by way of a deposition. In case of a high molecular device, although many devices using a fluorescent material have been studied, research materials on devices using a phosphorescent material are disclosed in Japanese Patent Application No. 2000-68363.

An organic polymer EL device has merits in that it is advantageous to fabricate a large area device since a light-emitting device can be fabricated using a spin-coating process. However, devices using a phosphorescent material have not been reported regardless of their possibility since they are limited in the spin-coating process.

SUMMARY OF THE INVENTION

Accordingly, it is an aspect of the present invention to provide an organic EL device in which a high molecular light-emitting layer can be patterned, and color purity and light-emitting characteristics are improved when fabricating a full color organic polymer EL device by laser induced thermal imaging.

Additional aspects and advantages of the invention will be set forth in part in the description which follows and, in part, will be obvious from the description, or may be learned by practice of the invention.

To achieve the above and/or other aspect of the present invention, there is provided an organic EL device comprising a first electrode, a hole transport layer, a light-emitting layer, and a second electrode, wherein the light-emitting layer comprises a light-emitting film mixture of a host substance having an optically inactive polymer, and a phosphorescent dopant capable of emitting light using a triplet state after absorbing an energy received.

The term "optically inactive" means that final light-emitting spectrum and color coordinates are not influenced in a visible ray range of 400 to 800 nm where light-emitting substances are shown even though additives are introduced.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
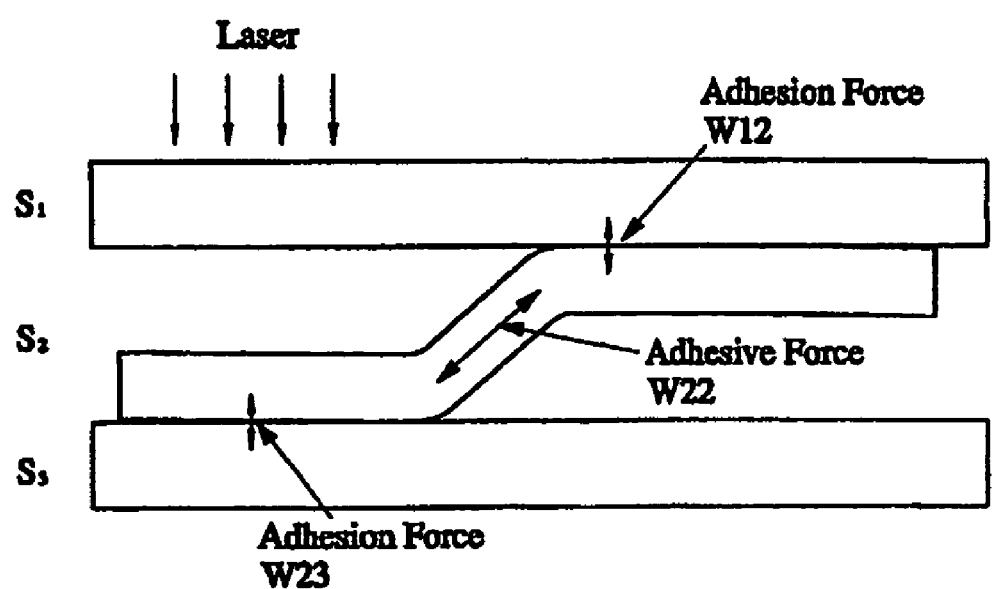
FIG. 1 is a drawing which illustrates a transfer mechanism where an organic EL layer used in an organic EL device is transfer patterned using a laser.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

FIG. 1 shows a transfer patterning of an organic EL layer using a laser.

As illustrated in FIG. 1, an organic layer S2 which is adhered onto a substrate S1 must be separated from a part where a laser is not received, as the organic layer ("film") S2 is separated from the substrate S1 and transferred to a substrate S3 by an action of the laser.

Factors influencing transfer characteristics include an adhesion force (W12) between the substrate S1 and the film S2, an adhesive force (W22) between parts of the film S2, and an adhesion force (W23) between the film S2 and the substrate S3. These adhesion and adhesive forces are represented as surface tensions (y1, y2, y3) (the surface tension of S1, S2 and S3, respectively) and interfacial tensions (y12, y23) (the interfacial tension between S1 and S2 and the interfacial tension between S2 and S3, respectively) of each as in the following expressions:

$W12=y1+y2-y12$ $W22=y2 \times 2$ $W23=y2+y3-y23$

To improve laser induced thermal imaging characteristics, the adhesive force W22 between the parts of the film S2 should be less than an adhesion force between the respective substrates S1 and S3 and the film S2. Generally, a high molecular film is used as a light-emitting substance composing a light-emitting layer in an organic EL device. However, a high molecular film may not have good transfer characteristics, where a laser patterning is used, since it has a high adhesive force between parts of the film S2. This is because the high molecular film S2 may have a high molecular weight. Therefore, transfer characteristics can be improved either by lowering an adhesive force between parts of the film S2 or by increasing an adhesion force between the film S2 and one of the substrates S1 or S3.

According to an embodiment of the present invention, a mixture film is provided in which a host substance and a phosphorescent dopant are mixed in an appropriate mixing ratio so as to be used in a light-emitting layer of an organic EL device. The host substance includes a matrix and a low molecular electric charge transporter.

That is, the host substance is a light-emitting film mixture in which the matrix is selected from a group consisting of an optically inactive high molecular material, a high molecular material having an electric charge transport capability, and a carbazole based low molecular material, is mixed with the low molecular transporter with the transport capability of an electric charge such as a hole or an electron.

Therefore, the matrix has a coating property so as to form a film, i.e., S2, and the low molecular transporter is mixed into the matrix so as not to significantly drop an adhesion force of the matrix between a substrate (i.e., S1 or S3) and the film S2. Furthermore, an adhesive force between parts of the film S2 is relatively weakened so as to improve transfer characteristics, while electrical characteristics of a device thereof are not dropped.

Furthermore, the phosphorescent dopant does not influence the transfer characteristics to a large extent, but does influence light-emitting characteristics as it is added in a relatively small amount.

The host substance used in the present invention should be a material in which one light-emitting substance transfers energy to the other light-emitting substance (or a dopant material) by receiving energy, that is, a material enabling the use of an "energy transfer."

The matrix composing the host substance used in the present invention may be an optically inactive high molecular material such as polystyrene, poly styrene-butadione copolymer, polymethylmethacrylate, polyalphamethylstyrene, styrene-methylmethacrylate copolymer, polybutadiene, polycarbonate, polyethyleneterephthalate, polyestersulfonate, polysulfonate, polyarylate, unsaturated polyamide, transparent fluorocarbon resin or transparent acryl based resin, a carbazole, arylamine, perylene or pyrrol based high molecular material having an electric charge transport capability, or a carbazole, arylamine, hydrazone, stilbene, starburst based low molecular material which are spin-coatable to provide a uniform film.

The low molecular transporter composing the host substance may be a carbazole based, aryl amine based, hydrazone based, stilbene based or starburst based low molecular material having a hole transport capability, or an oxadiazole based or starburst based low molecular material with an electron transport capability. The low molecular transporter may also be an oxadiazole based or starburst based low molecular material having an electron transport capability. The carbazole based low molecular material may be 4,4'-N,N'-dicarbazole-biphenyl (CBP). The oxadiazole based low molecular material may be 2-(4-biphenylyl)-5-(4-tert-butylphenyl)-1,3,4-oxadiazole (PBD).

The low molecular transporter may have a weight ratio ranging from 50% to 75% for the total of the host substance. Furthermore, a phosphorescent dopant may be used as a dopant material that is emitted by receiving an energy from the host substance. A light-emitting efficiency of the phosphorescent dopant can be theoretically increased up to four times its normal efficiency by using a phosphorescent material capable of using a triplet differently from a fluorescent material using only a singlet.

The phosphorescent dopant includes high and low molecular complexes of organic metals of Ir, Pt, Eu and Tb. A phosphorescent dopant of a green light-emitting substance used may be tris (2-phenylpyrridine) iridium (IrPPy). Devices of red, green and blue colors can be fabricated since light-emitting spectrums are different according to bonded ligands in the organic metal complexes. The phosphorescent dopant may be used in a weight ratio of 10% or less for the total light-emitting film mixture.

Although a light-emitting layer according to an embodiment of the present invention is explained in terms of a green light-emitting layer, it is to be understood that the present invention is not limited to the green light-emitting layer, and can be applied to, for example, red and blue light-emitting layers.

A method of fabricating an organic EL device using a polymer material of the present invention is described as follows:

A host substance and a low molecular transporter are dissolved into toluene in a concentration range of 1.0 to 2.0% while a phosphorescent dopant is dissolved into dichloroethane (DCE) in a concentration range of 0.1 to 0.2%. Each of the materials is mixed in weight ratios of 90%≦host substances≦99% and 1%≦phosphorescent dopant≦10%, and the host substance is mixed in weight ratios of 25%≦matrix materials 50% and 50%≦low molecular transporter≦75% after completely dissolving the solutions, after sufficiently agitating each solution at a temperature of 60° C. for more than 3 hours. The solution is spin-coated on a transferring film to prepare a mixture film with a thickness of 30 to 50 nm is prepared after agitating the mixed solution at an ordinary temperature for more than 1 hour.

A patterned light-emitting layer is formed by spin-coating a hole injection layer on a pretreated transparent substrate to a thickness of 60 to 80 nm and transferring the mixture film on the substrate by using a laser after covering an organic layer coated transfer film on the transparent substrate. Ordinary hole injection materials such as PEDOT or PANI are used as the hole injection layer.

Furthermore, an electron transport layer is subsequently deposited on the hole inhibition layer deposited light-emitting layer to a thickness of 5 to 20 nm after heat treating the patterned light-emitting layer at a temperature of 80° C. for 1 hour and depositing a hole inhibition layer on the heat treated patterned light-emitting layer. An organic EL device is completed by depositing LiF and Al as a cathode, in turn, on the deposited electron transport layer and encapsulating the deposited light-emitting layer using a glass substrate.

The hole inhibition layer may be bis-2-methyl-8-quinolinolato para-phenylphenolato aluminum (III) (BAlq), and the electron transport layer may be tris (8-hydroxyquinoline) aluminum (III) (Alq3).

An organic EL device having an edge roughness of 5 μm or less, when forming patterns, can be fabricated since the structure of the above-fabricated organic EL device of the present invention has superior transfer characteristics compared to the structure of an existing organic EL device.

Although the present invention describes use of a laser induced thermal imaging, it is understood that other transferring methods, including a spin coating process can be used.

EXAMPLES

Examples provided below are for an illustrative purpose and to help understand the present invention. Therefore, it is understood that the present invention is not limited to the following examples.

Examples 1 and 4

A method of fabricating an organic EL device using a light-emitting layer according to the present invention is as follows.

Poly (vinylcarbazole) (PVK: manufactured by SIGMA-ALDRICH CORPORATION) as a matrix of a host substance, and 4,4'-N,N'-dicarbazole-biphenyl (CBP; manufactured by UNIVERSAL DISPLAY CORPORATION), as a low molecular hole transporter material, were respectively dissolved into toluene in the range of 1.0 to 2.0 wt. %. An organic complex including iridium, that is, tris (2-phenylpyrridine) iridium (IrPPy; manufactured by UNIVERSAL DISPLAY CORPORATION) as a phosphorescent dopant, was dissolved into dichloroethane (DCE; manufactured by SIGMA-ALDRICH CORPORATION) in a concentration of 0.1 to 0.2%. Each of the materials was mixed in appropriate weight ratios after completely dissolving the solutions by sufficiently agitating each solution at a temperature of 60° C. for more than 3 hours.

A mixture film having a thickness of 30 to 50 nm was prepared by spin-coating the mixed solution on a transfer film after agitating the mixed solution at an atmospheric temperature for more than 1 hour. A hole injection layer PEDOT/PSS, manufactured by BAYER AG CORPORATION, was spin-coated on an ITO substrate to a thickness of 60 to 80 nm after cleaning the ITO substrate and then UV-$O_3$ treating the cleaned ITO substrate. The mixture film was transferred onto the substrate by using a laser after covering an organic film coated transfer film on the PEDOT/PSS coated ITO substrate. A patterned light-emitting layer was heat treated at a temperature of 80 □ for 1 hour so that bis-2-methyl-8-quinolinolato para-phenylphenolato aluminum (III) (Bail; manufactured by UNIVERSAL DISPLAY CORPORATION), as a hole inhibition layer could be deposited to a thickness of 5 nm, and tris (8-hydroxyquinoline) aluminum (III) (Alq3; manufactured by SIGMA-ALDRICH CORPORATION), as an electron transport layer, could be deposited to a thickness of 5 to 20 nm on the heat treated patterned light-emitting layer. An organic EL device is completed by depositing 1 nm of LiF and 300 nm of Al a as cathode, in turn, on the deposited electron transport layer and encapsulating the deposited light-emitting layer using a glass substrate. An energy transfer phenomenon into phosphorescence is shown in a range that a weight concentration of IrPPy is 3% or more. The weight ratio ranges of PVK and CBP, in which a laser induced thermal imaging is possible and the efficiency of the thermal imaging is satisfactory, were 0.25≦PVK≦0.5, and 0.5≦CBP≦0.75, wherein edge roughness of the transferred film is 5 or less. As represented in Table 1 below, the efficiency of the device is 24.9 Cd/A (9.2 lm/W), and color coordinates are 0.28 and 0.63 (500 Cd/m² at CIE1931 and 8.5 V) under the optimum conditions where a weight ratio of PVK:CBP:IrPPy is 1:2:0.1, and a thickness of Alq3 is 20 nm.

TABLE 1

| Structure of device: ITO/hole transport layer(60 nm)/light-emitting layer(40 nm)/BAlq(5 nm)/ Alq3/LiF(1 nm)/Al(30 nm) | PVK/CBP/IrPPy | Alq3 Thickness(nm) | Efficiency (Cd/A) | Efficiency (lm/W) | Driving voltage (V) at 500 Cd/m² | CIE x | CIE y |
|---|---|---|---|---|---|---|---|
| EXAMPLE 1 | 1:1:0.05 | 5 | 16.0 | 5.3 | 9.8 | 0.28 | 0.63 |
| EXAMPLE 2 | 1:2:0.1 | 5 | 15.8 | 5.9 | 8.5 | 0.28 | 0.63 |
| EXAMPLE 3 | 1:1:0.05 | 20 | 21.4 | 7.1 | 9.8 | 0.28 | 0.63 |
| EXAMPLE 4 | 1:2:0.1 | 20 | 24.9 | 9.2 | 8.5 | 0.28 | 0.63 |

Examples 5 to 8

Examples 5 to 8 have the same structures of devices as in Examples 1 to 4, except that oxadiazole based PBD was used as the low molecular hole transport material. Poly (vinylcarbazole) (PVK: manufactured by SIGMA-ALDRICH CORPORATION), as a matrix of host and 2-(4-biphenylyl)-5-(4-tert-butylphenyl)-1,3,4-oxadiazole (PBD; manufactured by SIGMA-ALDRICH CORPORATION), as the low molecular hole transport material, were respectively dissolved into toluene in the range of 1.0 to 2.0 wt. %. An organic complex including iridium, that is, tris (2-phenylpyrridine) iridium (IrPPy; manufactured by UNIVERSAL DISPLAY CORPORATION), as a phosphorescent material, was dissolved into dichloroethane (DCE; manufactured by SIGMA-ALDRICH CORPORATION) in a concentration of 0.1 to 0.2%. Each of the materials was mixed in appropriate weight ratios after completely dissolving the solutions by sufficiently agitating each solution at a temperature of 60° for more than 3 hours. A mixture film having a thickness of 30 to 50 nm was prepared by spin-coating the mixed solution on a transfer film after sufficiently agitating the mixed solution at an atmospheric temperature for more than 3 hours.

A hole injection layer PEDOT/PSS manufactured by BAYER AG CORPORATION is coated on an ITO substrate to a thickness of 60 to 80 nm after cleaning the ITO substrate and then UV-$O_3$ treating the cleaned ITO substrate. The mixture film is transferred onto the substrate by using a laser after covering an organic film coated transfer film on the PEDOT/PSS coated ITO substrate. A patterned light-emitting layer is heat treated at a temperature of 80° C. for 1 hour so that bis-2-methyl-8-quinolinolato para-phenylphenolato aluminum (III) (BAlq; manufactured by Universal Display Corporation), as a hole inhibition layer, can be deposited to a thickness of 5 nm, and tris (8-hydroxyquinoline) aluminum (III) (Alq3; manufactured by Sigma Aldrich Corporation), as an electron transport layer, can be deposited to a thickness of 5 to 20 nm on the heat treated patterned light-emitting, layer. An organic EL device is completed by depositing 1 nm of LiF and 300 nm of Al as a cathode, in turn, on the deposited electron transport layer and encapsulating the deposited light-emitting layer using a glass substrate. An energy transfer phenomenon into phosphorescence is shown in a range that a weight concentration of IrPPy is 3% or more.

The weight ratio ranges of PVK and PBD, in which a laser induced thermal imaging is possible and the efficiency of the thermal imaging is satisfactory, were $0.25 \leq PVK \leq 0.5$, and $0.5 \leq PBD \leq 0.75$, wherein edge roughness of the transferred film is 5° or less. As represented in Table 2 below, the efficiency of the device is 22.2 Cd/A (8.2 lm/W), and color coordinates are 0.28 and 0.63 (500 Cd/m$^2$ at CIE1931 and 8.5 V) under the optimum conditions where a weight ratio of PVK:PBD:IrPPy was 1:1:0.01, and a thickness of Alq3 is 20 nm.

TABLE 2

Structure of the device: ITO/hole transport layer(60 nm)/
light-emitting layer(40 nm)/BAlq(5 nm)/
Alq3/LiF(1 nm)/Al(300 nm)

|  | PVK/PBD/IrPPy | Alq3 Thickness(nm) | Efficiency (Cd/A) | Efficiency (lm/W) | Driving voltage (V) at 500 Cd/m$^2$ | CIE x | CIE y |
|---|---|---|---|---|---|---|---|
| EXAMPLE 5 | 1:1:0.05 | 5 | 18.7 | 6.9 | 8.5 | 0.28 | 0.63 |
| EXAMPLE 6 | 1:2:0.1 | 5 | 12.8 | 5.0 | 8.0 | 0.28 | 0.63 |
| EXAMPLE 7 | 1:1:0.05 | 20 | 22.2 | 8.2 | 8.5 | 0.28 | 0.63 |
| EXAMPLE 8 | 1:2:0.1 | 20 | 19.9 | 7.8 | 8.0 | 0.28 | 0.63 |

As described above, a device having a mixture film using a phosphorescent material of the present invention has an efficiency of 24.9 Cd/A at the same luminance condition of 10 Cd/A, while a conventional green light-emitting organic polymer EL device fabricated by a spin-coating has a maximum efficiency of about 10 Cd/A. Accordingly, transfer characteristics of an organic polymer EL device of the present invention are excellent as the efficiency is improved by more than 100%. Furthermore, an edge roughness of the present device after a laser induced thermal imaging was also good, and is 5 µm or less.

Figure 2:
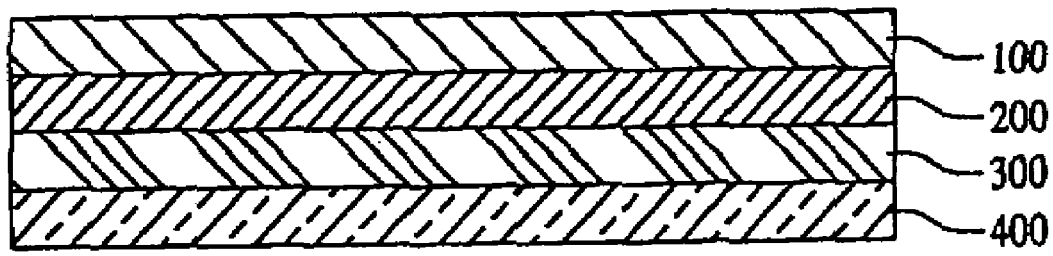
FIG. 2 is a cross-sectional view illustrating an organic EL display device according to the present invention.

FIG. 2 shows a cross-sectional view illustrating an organic EL display device incorporating an organic EL layer according to the present invention. In FIG. 2, reference numerals 100, 200, 300 and 400 denote a cathode, a light-emitting layer, a hole transporting layer, and an anode, respectively.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for fabricating an organic electroluminescent device, the method comprising:
   providing a substrate;
   forming a first electrode on the substrate;
   forming a hole transport layer over the first electrode;
   forming a light-emitting layer by Laser Induced Thermal Imaging (LITI) on the hole transport layer; and
   forming a second electrode over the light-emitting layer,
   wherein the light-emitting layer comprises a host substance and a phosphorescent dopant.

2. The method according to claim 1, wherein the phosphorescent dopant is a low molecular weight material or a high molecular weight material that enables phosphorescent light emission in a triplet and is a complex of an organic metal selected from the group consisting of Ir, Pt, Eu and Tb.

3. The method according to claim 1, wherein the phosphorescent dopant is tris(2-phenylpyrridine)iridium (IrPPy).

4. The method according to claim 1, wherein the phosphorescent dopant is 10% or less by weight of the light-emitting layer.

5. The method according to claim 1, further comprising forming a hole inhibition layer and/or an electron transport layer.

6. The method according to claim 1, wherein the host substance is a mixture of a matrix material selected from the group consisting of an optically inactive high molecular weight material, a high molecular weight material having an electric charge transport capability and a low molecular weight material with a film-forming ability with a spin-coating process and a low molecular weight electric charge transporter with hole transport capability or a low molecular weight molecular charge transporter with electron transport capability.

7. The method according to claim 6, wherein the low molecular weight material with a film forming ability using a spin-coating process is selected from the group consisting of carbazole, arylamine, hydrazone, stilbene, starburst based low molecular weight materials which are spin-coatable to give uniform films.

8. The method according to claim 6, wherein the optically inactive high molecular weight material is selected from the group consisting of polystyrene, poly(styrene-butadione) copolymer, polymethylmethacrylate, polyalphamethylstyrene, styrene-methylmethacrylate copolymer, polybutadiene, polycarbonate, polyethyleneterephthalate, polyestersulfonate, polysulfonate, polyarylate, unsaturated polyamide, transparent fluorocarbon resin and transparent acryl based resin.

9. The method according to claim 6, wherein the high molecular weight material having electric charge transport capability is a high molecular weight material selected from the group consisting of carbazole, arylamine, perylene, and pyrrol based materials.

10. The method according to claim 6, wherein the low molecular weight electric charge transporter with hole transport capability is comprised of a carbazole, arylamine, hydrazone, stilbene, or a starburst based material, and the low molecular weight electric charge transporter with electron transport capability is an oxadiazole, starburst based material.

11. The method according to claim 10, wherein the carbazole based low molecular weight material is 4,4'-N,N'-dicarbazole-biphenyl (CBP) and the oxadiazole based low molecular weight material is 2-(4-biphenylyl)-5-(4-tert-butylphenyl) 1,3 , 4-oxadiazole (PBD).

12. The method according to claim 6, wherein the low molecular weight electric charge transporter is 50% to 75% by weight of the total of the host substance.

13. The method according to claim 8, wherein the phosphorescent dopant is a low molecular weight material or a high molecular weight material capable of phosphorescent light emission in the triplet state as an organic metal complex of Ir or Pt.

14. The method according to claim 9, wherein the phosphorescent dopant is a low molecular weight material or a high molecular weight material capable of phosphorescent light emission in the triplet state as an organic metal complex of Ir or Pt.

15. The method according to claim 13, wherein the phosphorescent dopant is tris (2-phenylpyrridine) iridium (IrPPy).

16. The method according to claim 13, wherein the phosphorescent dopant is 10% or less by weight of the light-emitting layer.

17. The method according to claim 1, wherein the matrix comprises an optically inactive polymer.

18. A method for fabricating an organic electroluminescent device, the method comprising:
providing a substrate;
forming a first electrode on the substrate;
forming a hole transport layer over the first electrode;
forming a light-emitting layer by Laser Induced Thermal Imaging (LITI) on the hole transport layer; and
forming a second electrode over the light-emitting layer,
wherein the light-emitting layer comprises a host substance and a phosphorescent dopant, and the host substance comprises a matrix and a low molecular weight electric charge transporter.

19. The method according to claim 18, wherein the matrix comprises a coating property to form a film, and the low molecular electric charge transporter is mixed into the matrix so as not to significantly drop an adhesion force of the matrix between a substrate and the film.

20. The method according to claim 18, wherein an adhesive force between parts of the film is relatively weakened so as to improve transfer characteristics of the film from one substrate to another, while electrical characteristics of the organic electroluminescent device are not dropped.

21. The method according to claim 18, wherein the phosphorescent dopant is 10% or less by weight of the light-emitting film layer.

22. The method according to claim 19, wherein the low molecular weight electric charge transporter is 50% to 75% by weight of the host substance.

23. The method according to claim 18, wherein the matrix is poly(vinyl carbazole).

24. A method for fabricating an organic electroluminescent device, the method comprising:
forming a first electrode on a substrate;
forming a hole transport layer over the first electrode;
forming a light-emitting layer by a Laser Induced Thermal Imaging (LITI) method on the hole transport layer; and
forming a second electrode over the light-emitting layer,
wherein the light-emitting layer comprises a host substance and a phosphorescent dopant, wherein the host substance comprises a matrix and a low molecular weight electric charge transporter and wherein the matrix is an optically inactive high molecular weight material selected from the group consisting of polystyrene, poly(styrene-butadione) copolymer, polymethylmethacrylate, polyalphamethylstyrene, styrene-methylmethacrylate copolymer, polybutadiene, polycarbonate, polyethyleneterephthalate, polyestersulfonate, polysulfonate, polyarylate, unsaturated polyamide, transparent fluorocarbon resin and transparent acryl based resin.

* * * * *